United States Patent [19]

Pickett

[11] Patent Number: 4,754,233

[45] Date of Patent: Jun. 28, 1988

[54] LOW NOISE ULTRA HIGH FREQUENCY AMPLIFIER HAVING AUTOMATIC GAIN CONTROL

[75] Inventor: Michael N. Pickett, Phoenix, Ariz.

[73] Assignee: Motorola, Inc., Schaumburg, Ill.

[21] Appl. No.: 64,490

[22] Filed: Jun. 22, 1987

[51] Int. Cl.[4] .......................... H03F 3/04; H03G 3/10
[52] U.S. Cl. .................................... 330/311; 330/296; 330/285
[58] Field of Search ............... 330/300, 311, 291, 296, 330/285

[56] References Cited

U.S. PATENT DOCUMENTS 4,587,495  5/1986  Osawa et al. ..................... 330/311

Primary Examiner—Gene Wan
Attorney, Agent, or Firm—Maurice J. Jones

[57] ABSTRACT

A radio frequency amplifier includes a bipolar and a field effect transistors (FET) which are cascoded for efficient operation and simultaneous gain control. Bias circuitry is connected to the control electrode of the FET to stabilize the output bias thereof. Negative feedback circuitry is connected between the output electrode of the FET and the control electrode of the bipolar transistor to stabilize the other bias levels within the circuitry. An AGC circuit is connected to the feedback circuitry to provide an automatic gain control function.

9 Claims, 1 Drawing Sheet

LOW NOISE ULTRA HIGH FREQUENCY AMPLIFIER HAVING AUTOMATIC GAIN CONTROL

BACKGROUND OF THE INVENTION

Modern radio receiver designs often require amplifiers for increasing the power level of input radio frequency (RF) signals. An amplifier for use in this application would ideally have a low noise figure, low power consumption, high gain and a high degree of linearity. Moreover, such amplifier would ideally further have a broad bandwidth, automatic gain control (AGC) capability, low cost, small size and a high degree of reverse isolation.

There are many prior art amplifier circuits some of which might meet some of the foregoing criteria. One prior art amplifier includes a single field effect transistor (FET) connected in a common source configuration which tends to undesirably provide narrow band operation, but has desirably low noise figures for some applications. Other prior art amplifier designs utilize a bipolar transistor and voltage controlled attenuators which provide wide band operation and desirable noise figures, but these circuits are generally expensive and consume an undesirable amount of power for some applications. Still other prior art preamplifiers do not have AGC capability.

Moreover, some prior art amplifier designs undesirably couple signals generated in circuits connected to the output terminals thereof to circuits coupled to the input terminals thereof. Such circuits do not have a sufficiently high degree of "reverse isolation" and they are not suitable for use as receiver preamplifiers because they allow local oscillator signals to be radiated by the receiver antenna, for instance.

SUMMARY OF THE INVENTION

The object of one aspect of the invention is to provide inexpensive amplifier circuits which have a broad band of operation and a low noise figure.

Another object of another aspect of the invention is to provide amplifier circuits having low power requirements.

A further object of a further aspect of the invention is to provide improved amplifier circuit configurations which are simple, inexpensive and have a variable power gain which is controlled in response to a control signal.

Still another object of another aspect of the invention is to provide amplifier circuits having a high degree of reverse isolation.

Briefly, an amplifier circuit of one embodiment includes a bipolar transistor having its output electrode connected to the input electrode of a field effect transistor (FET) so that they are connected in cascode. A bias network controls the bias on the control electrode of the FET to thereby control the bias voltage provided by the FET to the output electrode of the bipolar transistor. A feedback network responds to undesirable changes in nominal bias conditions to provide negative feedback through a bias feedback path to the control electrode of the bipolar transistor to stabilize operating bias conditions of the bipolar transistor and the FET. As a result, the transistors are biased for low noise and wide bandwidth operation. Also, the series connection of the main electrodes of these transistors enables them to operate with minimized power dissipation and to provide a high degree of reverse isolation. An automatic gain control current sink, connected to the bias feedback path, responds to an automatic gain control signal to shunt more or less of the base drive of the bipolar transistor to thereby provide simultaneous gain control of the bipolar transistor and the FET. An input impedance matching circuit is coupled to the control electrode of the bipolar transistor and an output impedance matching circuit is coupled to the output electrode of the FET to provide impedance matching which maximizes efficiency.

DETAILED DESCRIPTION OF THE PREFERRED EMBODIMENT

Figure 1:
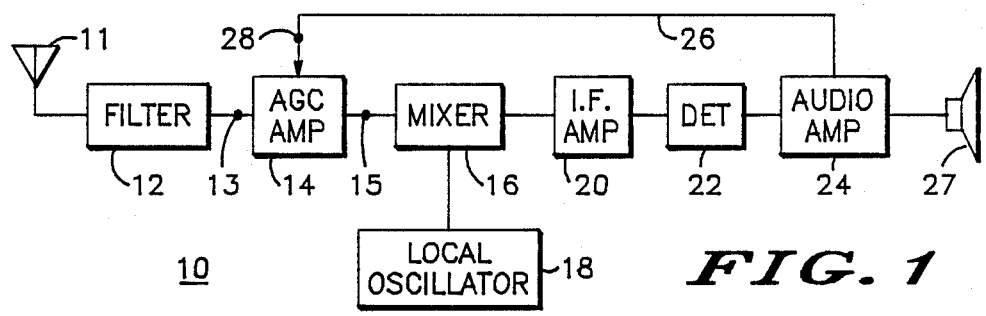
FIG. 1 is a block diagram of a radio frequency receiver which includes an amplifier circuit in accordance with the invention.

The block diagram of FIG. 1 illustrates a well-known radio receiver system 10. RF signals received by antenna 11 are applied to filter 12 which is connected to input terminal 13 of preamplifier 14, which amplifies the signals from filter 12 to increase the power level thereof. Mixer 16, which is connected to output terminal 15 of preamplifier 14, mixes the amplified RF signals with a local oscillator signal from local oscillator 18 to provide an intermediate frequency (IF) signal to IF amplifier 20. The IF signal is demodulated by detector 22 and applied to audio amplifier 24 which amplifies the audio signal component and applies it to speaker 27. Audio amplifier 24 includes circuitry of a known configuration for continuously sensing the magnitude of the audio signal to develop a gain control signal which is applied by feedback conductor 26 to gain control electrode 28 of amplifier 14 to provide automatic gain control (AGC). If the magnitude of the audio signal is too large, then the gain control signal reduces the gain of amplifier 14 to hold the magnitude of the audio signal within a desired range. Alternatively, if the magnitude of the audio signal is too small then the gain control signal increases the gain of amplifier 14 to increase the magnitude of the audio signal thereby keeping the magnitude of the audio signal within a predetermined range.

Figure 2:
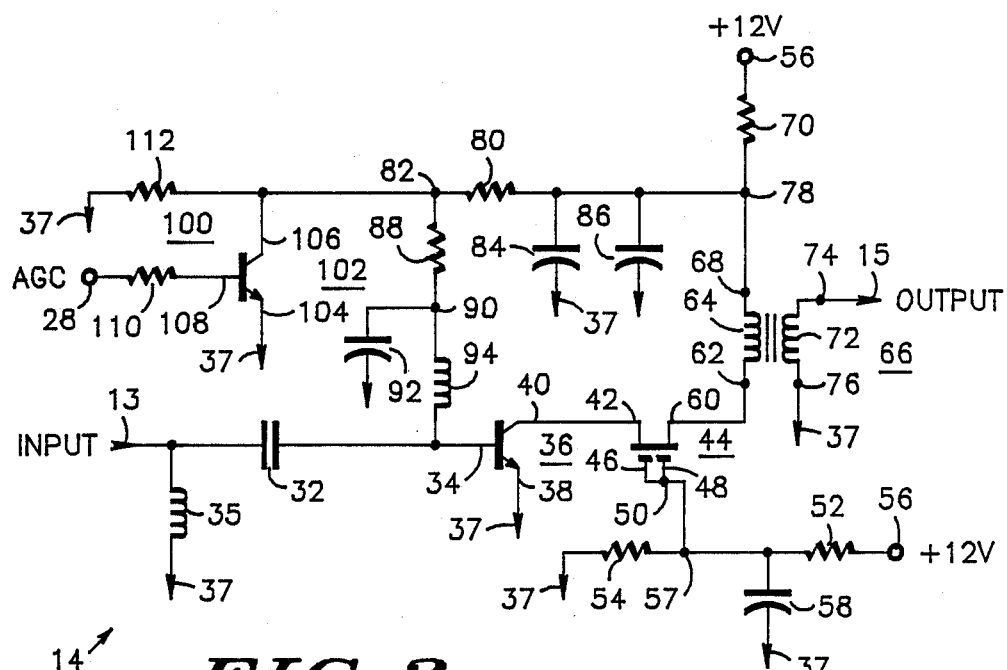
FIG. 2 is a schematic diagram of a particular amplifier circuit in accordance with the invention.

FIG. 2 is a schematic diagram of AGC, preamplifier 14 in accordance with a preferred embodiment of the invention. RF input terminal 13 is coupled through RF coupling and direct current (DC) blocking capacitor 32 to the base or control electrode 34 of bipolar, NPN transistor 36. Inductor 35 is connected between input terminal 13 and ground or reference conductor 37. Components 32 and 35 provide a filter for impedance matching to assure efficient power transfer between input terminal 13 and NPN amplifier transistor 36. For example, components 32 and 35 transform the input impedance of transistor 36 to 50 ohms so that transistor 36 receives maximum power transfer from a 50 ohm source impedance connected to terminal 13.

Emitter or main electrode 38 of transistor 36 is connected directly to ground or reference conductor 37. This enables transistor 36 to operate at ultra high frequencies on the order of 200 to 400 megahertz (MHz).

Transistor 36 includes a collector or main electrode 40 which is connected to source or main electrode 42 of dual gate, insulated gate, gallium arsenide field effect transistor (IGFET) 44. Hence, bipolar transistor 36 is connected in "cascode" with IGFET 44. Gate electrodes 46 and 48 of IGFET 44 are connected together at node 50. A single gate IGFET or a PNP transistor could be used in place of IGFET 44 in some applications. Resistors 52 and 54 are connected in series between second or positive power supply conductor 56 and reference potential conductor 37. Node 57 between resistors 52 and 54 is connected to node 50 and coupled through capacitor 58 to ground or reference conductor 37. The positive power supply potential on terminal 56 can be 12 volts, for instance.

Terminal 62 of primary winding 64 of output transformer 66 is connected to drain electrode 60 of IGFET 44. Primary winding 64 further includes terminal 68 which is connected through resistor 70 to second power supply conductor terminal 56. Tranformer 66 further includes a secondary winding 72 having terminal 74 connected to output terminal 15 of circuit 14. Terminal 76 of secondary winding 72 is connected to reference conductor 37. Transformer 66 converts the impedance across primary winding 64 to 50 ohms across winding 72 to facilitate maximum power transfer into a 50 ohm load connected to terminal 15. Node 78 is connected through a feedback path including resistor 80 to node 82.

Decoupling capacitors 84 and 86 are connected between the conductor connected to node 78 and reference conductor 37 to provide a low impedance path for undesirable alternating current (AC) signals occurring at node 78 so that they do not adversely effect the level of the power supply potential applied to power supply conductor 56 or transistor 36, for instance. One of capacitors 84 and 86 conducts radio frequencies (RF) originating from base 34 of transistor 36 and the other conducts audio frequencies (AF) which originate from conductor 56. Resistor 88 is connected between AGC control node 82 and node 90. Capacitor 92 which is connected between node 90 and reference conductor 37 in cooperation with inductor 94 which is connected between node 90 and base electrode 34 of transistor 36, provide further decoupling to prevent the RF signals at base electrode 34 from adversely effecting the DC power supply voltage across terminals 37 and 56.

AGC circuit 100 includes a voltage controlled current sink having an NPN transistor 102 with emitter electrode 104 connected to reference supply conductor 37, collector electrode 106 connected to AGC node 82, and base electrode 108. Resistor 110 is connected between AGC control terminal 28 and base electrode 108 of transistor 102 and resistor 112 is connected between reference conductor 37 and collector electrode 106.

In analyzing the bias or quiescent operation of circuit 14, the capacitors thereof can be considered as open circuits and the inductors can be considered as short circuits for the DC. IGFET 44 is a depletion mode device which is normally on or conductive. The gate-to-source voltage of gallium arsenide IGFET 44 must exceed a predetermined negative threshold level to render IGFET 44 nonconductive. The values of bias resistors 52 and 54 are chosen such that IGFET 44 provides a desired collector bias voltage to transistor 36 which enables transistor 36 to not saturate and thus operate in the linear region of its transfer characteristic so that undesired harmonics are minimized. Also, the bias levels provided to transistor 36 may be chosen to provide maximized amplitude of the output signal thereof at collector electrode 40. The conductive path from power supply conductor 56 through resistors 70, 80 and 88, and inductor 94 provide base drive voltage and current for transistor 36 which conducts the source current of FET 44 between the emitter 38 and collector 40 electrodes thereof. The main or source and drain electrodes of FET 44 and of transistor 38 form a series path with resistor 70 between power supply conductor 56 and power supply conductor 37. Thus, transistors 44 and 36 share the same main current thereby minimizing the power consumption of circuit 14.

Resistor 70 provides negative feedback for stabilizing the gain and bias of transistors 38 and 44. More specifically, if the bias collector current of transistor 36 undesirably increases source-to-drain current of FET 44 will increase. Thus, the voltage at node 78 decreases because of the increased voltage drop across resistor 70 resulting from the increased current through transistors 44 and 36. As a result, less base drive is provided to transistor 38 thereby tending to reduce the collector current thereof. Alternatively, if the bias collector current of transistor 38 undesirably decreases then the voltage drop across resistor 70 decreases thereby providing more base drive which turns on transistor 38 to increase the collector current thereof and the source-to-drain current of transistor 44. This negative feedback operation stabilizes the DC operating points of transistors 36 and 44 and also enables circuit 30 to be more reproducible by allowing the use of components therein having the different characteristics which occur in devices of the same type because of variations in manufacturing process parameters, for instance.

IGFET 44 is operated in a common gate configuration and consequently, would create an undesirable amount of noise except for transistor 36. The common gate FET stage provides interstage impedance with additional gain and automatic gain control range. Common emitter amplifier 36 has a low noise figure. The composite noise figure for the combination of transistors 36 and 44 is equal to the noise figure of transistor 36 plus the noise figure of transistor 44 divided by the power gain of transistor 36. Consequently, the cascode combination of transistors 31 and 44 provides a composite noise figure having a low value. Moreover, transistor 36 is chosen to provide gain over a wide bandwidth. Therefore, the combination of transistors 36 and 44 provide a broad band amplifier stage having low noise and which is inexpensive to manufacture.

Figure 3:
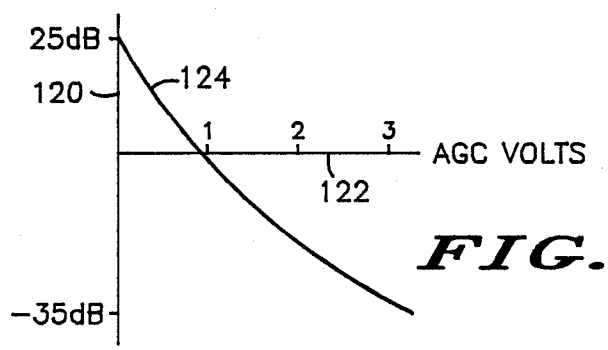
FIG. 3 is a graph showing the relationship between the power gain and control voltage magnitude for illustrating this operation of the circuit of FIG. 2.

During dynamic operation the input RF signal applied to terminal 13 is amplified by transistors 36 and 44 and coupled through transformer 66 to output terminal 15. The dynamic power gains of transistors 36 and 44 are proportional to the magnitudes of the main bias current thereof. The amount of dynamic power gain as indicated along ordinate axis 120 of FIG. 3 delivered by transistors 36 and 44 is directly proportional to the amount of DC base drive provided to transistor 36 but inversely proportional to the AGC voltage on terminal 28 which is indicated by the AGC voltage shown along abscissa axis 122 of FIG. 3. As previously explained, the base drive for transistor 36 is conducted through the series path including resistors 70, 80, 88 and inductor 94. Gain control of current sinking transistor 102 is rendered progressively more conductive by an increasingly positive going AGC control signal applied to terminal 28 and thereby shunts an increasing amount of the base drive current resulting in the lowering of the base drive potential provided to transistor 36 thereby simultaneously reducing the gain of transistors 36 and 44 of circuit 14 as indicated by curve 124 of FIG. 3. Alternatively, if the potential of the AGC control signal applied to terminal 28 moves in a negative direction thereby rendering current sinking transistor 102 less conductive, then less current is shunted through transistor 102 from node 82 thereby providing more base current for transistor 36 and the base voltage thereof will rise. Since the collector-to-emitter current of transistor 36 is also drawn through the source-to-drain path of transistor 44, AGC control transistor 102 simultaneously controls the gain of both transistors 36 and 44.

Amplifier 14 utilizes the interelectrode impedance of transistor 44 and the interelectrode impedance of transistor 36 which are combined by the cascode connection to provide a high degree of reverse isolation so that local oscillator signals within mixer 16 are not coupled to and radiated by antenna 10, for instance.

Values for the components of circuit 14 for operating in the ultra high frequency band between 225 MHz and 400 MHz are provided in the following table:

| | |
|---|---|
| Inductor 36 | 70 Nanohenrys |
| Capacitor 32 | 39 Picofarad |
| Transistor 36 | Motorola BFR 91 |
| Transistor 44 | NEC, NE41137 or Motorola MRF 966 |
| Resistor 52 | 3.3 Kilohm |
| Resistor 54 | 12 Kilohm |
| Capacitor 58 | 270 Picofarads |
| Transformer 72 | 3:1 on Ferrite Core |
| Resistor 70 | 270 Ohms |
| Capacitor 86 | 270 Picofarads |
| Resistor 80 | 8.2 Kilohm |
| Capacitor 84 | .01 Microfarad |
| Resistor 88 | 6.8 Kilohm |
| Capacitor 92 | 270 Picofarads |
| Inductor 94 | 1.0 Microhenry |
| Transistor 102 | 2N2222A |
| Resistor 110 | 390 Kilohm |
| Resistor 112 | 2.7 Kilohm |

A table of operating characteristics for circuit 14 with the above components, follows:

| FREQ MHz | GAIN db | FIGURE NF db | INPUT RETURN LOSS db | OUTPUT RETURN LOSS db | OUTPUT 3RD ORDER LINEARITY INTERCEPT dbm | AGC RANGE db | REVERSE ISOLATION db |
|---|---|---|---|---|---|---|---|
| 225 | 25.0 | 1.70 | 12 | 17 | +19 | 65 | 54 |
| 300 | 23.8 | 1.62 | 20 | 20 | +20 | 60 | 52 |
| 400 | 23.0 | 1.75 | 14 | 13 | +21 | 55 | 49 |

As would be apparent to those skilled in the art from the above table, circuit 14 provides a variety of desirable electronic characteristics and thus is useful in many applications. More specifically, circuit 14 provides low noise operation by utilizing low noise bipolar transistor 36 in the input stage and high gain over a broad bandwidth by utilizing IGFET 44. The simultaneous control of AGC capability and low power dissipation is accomplished by cascoding bipolar transistor 36 and IGFET 44 so that the main current flows serially through these devices. Circuit 14 takes up a small amount of space because it uses only a few components and circuit 14 can be manufactured at a low cost because the components thereof can be inexpensive partly because the negative feedback loop from node 78 to the base of transistor 36 stabilizes the operating bias points of circuit 14.

While the invention has been particularly shown and described with reference to a preferred embodiment, those skilled in the art will understand that changes in form and detail may occur therein without departing from the scope of the present invention.

I claim:

1. A radio receiver having an amplifier circuit for amplifying an input signal while dissipating a minimum amount of power, the amplifier circuit including in combination:

power supply means;

first transistor means having a control electrode, a first main electrode and a second main electrode, said control electrode being adapted to receive the input signal;

second transistor means having a control electrode, a first main electrode and a second main electrode, said first main electrode of said second transistor means being connected to said second main electrode of said first transistor means, said second main electrode of said second transistor means being coupled to said power supply means so that said first transistor means conducts the main current of said second transistor means to minimize power dissipation;

bias circuit means coupled to said second tranistor means for controlling the operating bias thereof and the bias at said second main electrode of said first transistor means;

bias feedback means coupled to said first transistor means for stabilizing the quiescent operating points of said first transistor means and said second transistor means; and said first transistor means and said second transistor means operating together to amplify the input signal to provide an output signal at said second main electrode of said second transistor means.

2. The radio receiver of claim 1 wherein said bias feedback means includes:

resistive means having a first terminal connected to said power supply means and a second terminal coupled to said second main electrode of said second transistor means; and feedback path means coupling said second terminal of said resistive means to said control electrode of said first transistor means, said resistive means being responsive to a bias change at said second output electrode of said second transistor means to provide a compensating signal through said feedback path means to said control electrode of said first transistor means for stabilizing said quiescent operating points of said first transistor means and said second transistor means.

3. The radio receiver of claim 1 wherein said first transistor means includes a bipolar transistor having a base electrode corresponding to said control electrode thereof, an emitter electrode corresponding to said first main electrode thereof, and a collector electrode corresponding to second main electrode thereof; and said second transistor means includes a field effect transistor having a gate electrode corresponding to said control electrode thereof, a source electrode corresponding to said first main electrode thereof and a drain electrode corresponding to said second main electrode thereof.

4. The radio receiver of claim 1 wherein the gains of said first and second transistor means are proportional to the magnitude of the main currents thereof which are proportional to the bias drive of said first transistor means, further including:

means for providing an automatic gain control signal; and electron control means being coupled to said feedback means, said electron control means being responsive to said automatic gain control signal to vary said bias drive of said first transistor means which simultaneously controls the main currents of said first and second transistor means to control the gain thereof.

5. The radio receiver of claim 4 wherein said electron control means includes a further transistor means having a first main electrode connected to said power supply means, a second main electrode coupled to said feedback path and a control electrode coupled to receive the automatic gain control signal.

6. An amplifier circuit suitable for increasing the power level of an input signal while maintaining a low noise figure and a wide bandwidth, including in combination:

first circuit means having an input terminal and an output terminal, said input terminal being adapted to receive the input signal, said first circuit means providing a further signal at said output terminal thereof;

first transistor means having a control electrode, an input electrode and an output electrode, said control electrode of said first transistor means being connected to said output electrode of said first circuit means for receiving said further signal;

second transistor means having a control electrode, an input electrode, and an output electrode, said input electrode of said second transistor means being connected to said output electrode of said first transistor means;

bias means connected to said control electrode of said second transistor means for biasing said second transistor means at a first operating point, said second transistor means being responsive to being biased at said first operating point to bias said output electrode of said first transistor means at a second operating point to enable said first and second transistors to provide the low noise figure and a wide bandwidth;

feedback means coupled between said output electrode of said second transistor means and said control electrode of said first transistor means for providing a bias control potential to said control electrode of said first transistor means, said feedback means being responsive to undesirable changes in bias levels at said output electrode of said second transistor means to control the conductivity of said first transistor means to compensate for said undesirable changes in bias level; and second circuit means coupled to said output electrode of said second transistor means for providing an output signal.

7. The amplifier circuit of claim 6 having a minimized power dissipation and ultra high frequecy operation, further including:

first power supply conductor means for providing a first predetermined power supply potential, said first power supply conductor being coupled to said feedback means;

second power supply conductor means for providing a second predetermined power supply potential;

said bias means coupling said first and second power supply conductor means to said control electrode of said second transistor means;

said first transistor means including a first bipolar transistor means having an emitter electrode corresponding to said input electrode, a base electrode corresponding to said control electrode and a collector electrode corresponding to said output electrode, said emitter electrode of said first bipolar transistor means being directly connected to said second power supply conductor means to facilitate the ultra high frequency operation;

said second transistor means including a field effect transistor means having a source electrode corresponding to said input electrode, a gate electrode corresponding to said control electrode, and a drain electrode corresponding to said output electrode; and said first bipolar transistor means and said field effect transistor means sharing common current from said first power supply conductor flowing between said input and output electrodes thereof to said second power supply conductor to minimize the power dissipation of said amplifier circuit.

8. The amplifier circuit of claim 7 for providing automatic gain control, further including:

gain control means connected to said feedback means, said gain control means including a second bipolar transistor means having a collector electrode coupled to said feedback means, a control electrode adapted to receive an automatic gain control signal, and an emitter electrode connected to said first power supply conductor; and said second bipolar transistor means being responsive to said gain control signal to sink controlled amounts of the drive otherwise provided to the base electrode of said first bipolar transistor means to thereby control the gain of the amplifier circuit.

9. The amplifier circuit of claim 6, further including a source on input signals having an impedance:

a load having an impedance;

said first circuit means includes an impedance transformation network for matching the input impedance of said first bipolar transistor means to said impedance of said source providing input signals; and said second circuit means includes a further impedance transformation means for matching the output impedance of said field effect transistor to the impedance of said load connected to the output terminal of said further impedance transformation means.

* * * * *